United States Patent [19]
Moslehi et al.

[11] Patent Number: 5,435,379
[45] Date of Patent: Jul. 25, 1995

[54] METHOD AND APPARATUS FOR LOW-TEMPERATURE SEMICONDUCTOR PROCESSING

[75] Inventors: Mehrdad M. Moslehi; Habib N. Najm; Ajit P. Paranjpe, all of Dallas; Cecil J. Davis, Greenville, all of Tex.

[73] Assignee: Texas Instruments Incorporated, Dallas, Tex.

[21] Appl. No.: 930,074

[22] Filed: Aug. 14, 1992

[51] Int. Cl.$^6$ ............................................. F28D 15/00
[52] U.S. Cl. .............................. 165/80.4; 250/441.11; 250/442.11; 250/443.1
[58] Field of Search ...................... 165/80.4, 30; 250/443.1, 441.11, 442.11

[56] References Cited

U.S. PATENT DOCUMENTS

3,566,960  3/1971  Stuart .............................. 165/104.31
5,093,579  3/1992  Amemiya et al. .............. 250/441.11

*Primary Examiner*—A. Michael Chambers
*Attorney, Agent, or Firm*—Peter T. Rutkowski; Richard L. Donaldson; William E. Hiller

[57] ABSTRACT

A chilling system (12) has a container (20) filled with a coolant (22). A pipe (16) traverses within the container (20) and the coolant (22) to a housing (18). Fluid flows within the pipe (16) and becomes chilled through the pipe (16) upon entering the container (20) and the coolant (22). The chilled fluid enters the housing (18) chilling the housing (18) through the pipe (16). In turn, semiconductor substrate (19) in contact with the housing (18) also is chilled.

45 Claims, 6 Drawing Sheets

METHOD AND APPARATUS FOR LOW-TEMPERATURE SEMICONDUCTOR PROCESSING

TECHNICAL FIELD OF THE INVENTION

This invention relates in general to microelectronics device fabrication processes and more particularly to a method and apparatus for chilling semiconductor material for low-temperature processing applications.

BACKGROUND OF THE INVENTION

Integrated circuit chip manufacturers fabricate semiconductor devices by various combinations of processes. Plasma processes that provide high etch selectivity, good anisotropy, good uniformity, low ion-induced damage, low particulate contamination, and meet fabrication throughput requirements are mandatory for the etching of submicrometer features. These objectives often impose conflicting and stringent requirements. Typically, selectivity is improved and ion-induced damage decreases while anisotropy and uniformity worsen as the operating process pressure increases. The persistent drive towards higher device integration density presents stringent requirements on the anisotropy of etch profiles and on the precise control of the widths of etched lines and spaces. This is to be achieved while maintaining the necessary selectivity and etch rate specifications.

One example of a process technology that is expected to achieve the above requirements is radio-frequency or RF-assisted remote microwave plasma etching. It is well recognized that this etch technology allows for fast etch rates, high selectivity, and low damage. However, it is also recognized that this technique suffers from unacceptable etch profiles, particularly at room temperature, as evidenced by the observed isotropic etching of the sidewalls. Isotropic sidewall etching (undercut) should be eliminated to improve the anisotropy of the etch profile.

One technique in eliminating the isotropic sidewall etch is to chill the semiconductor substrate down to cryogenic temperatures. Temperatures required for acceptable anisotropic etch profiles usually occur below $-100°$ C. Conventional liquid-coolant-based refrigeration equipment cannot achieve such low temperatures or provide sufficient cooling load capacities. Further, conventional refrigeration systems utilize bulky heat exchangers and noisy compressors that are unsuitable for semiconductor device processing. Such systems occupy large and expensive clean room floor space, cause vibrations, and generate undesirable particulates in the semiconductor processing chamber. The thermal response time of conventional systems is slow and unsuitable in applications where rapid temperature cycling or adjustments to cooling load changes have to be implemented.

From the foregoing, it may be appreciated, that a need has arisen for a method and apparatus for chilling semiconductor substrates that provide low temperature, good thermal response time, improved cooling load capacity, and are suitable for semiconductor device processing. A need has also arisen to provide a method and apparatus for chilling semiconductor substrate that improves etch profile anisotropy by eliminating isotropic sidewall etch. Further, a need has arisen for a method and apparatus for chilling semiconductor substrates at a reduced cost and without bulky equipment as compared to conventional refrigeration systems.

SUMMARY OF THE INVENTION

In accordance with the present invention, a method and apparatus for chilling semiconductor substrates are provided which substantially eliminate or reduce disadvantages and problems associated with conventional refrigeration systems.

The apparatus includes a pipe that traverses within a container and extends to a housing. The housing is in contact with the semiconductor substrate. Fluid flows within the container through the pipe to the housing. The fluid is chilled within the container and flows to the housing chilling semiconductor substrate in contact with the housing.

The present invention provides various technical advantages over conventional refrigeration systems. For example, one technical advantage is in chilling the semiconductor substrate without affecting the etching process environment through noise, vibration, and undesirable particulates. Another technical advantage is in providing low substrate temperature, improved cooling capacity, and good thermal response time for semiconductor processing. Still another technical advantage is in improving etch profile anisotropy through chilling the semiconductor substrate. Yet another technical advantage is in providing a more cost efficient chilling system without using bulky equipment found in conventional refrigeration systems. Other technical advantages are readily apparent to one skilled in the art from the following figures, descriptions, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like parts, in which.

DETAILED DESCRIPTION OF THE INVENTION

Figure 1:
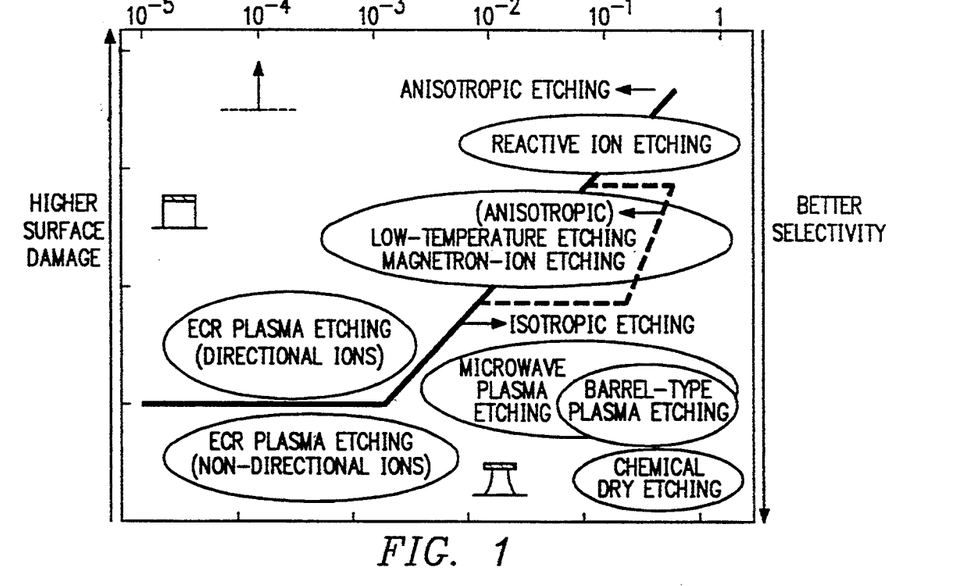
FIG. 1 is a qualitative plot of plasma-induced surface damage and etch selectivity versus process pressure for various types of plasma etching techniques.

FIG. 1 shows the process parameter domain of several plasma-assisted etching techniques. On the vertical axis, higher ion energies correspond to higher plasma-induced surface damage and lower etch selectivity values. The horizontal axis shows the etch process pressure range. The graph also indicates the boundary between the isotropic and anisotropic etching domains. Due to a larger mean-free path and reduced scattering for the activated ions, lower etching process pressures favor anisotropic etching. However, the anisotropic etch domain can be enlarged as shown in the graph by chilling the semiconductor substrate in the etching process. The present invention provides a way to chill semiconductor wafers in order to enhance the anisotropic etch domain for most etching techniques available.

Figure 2:
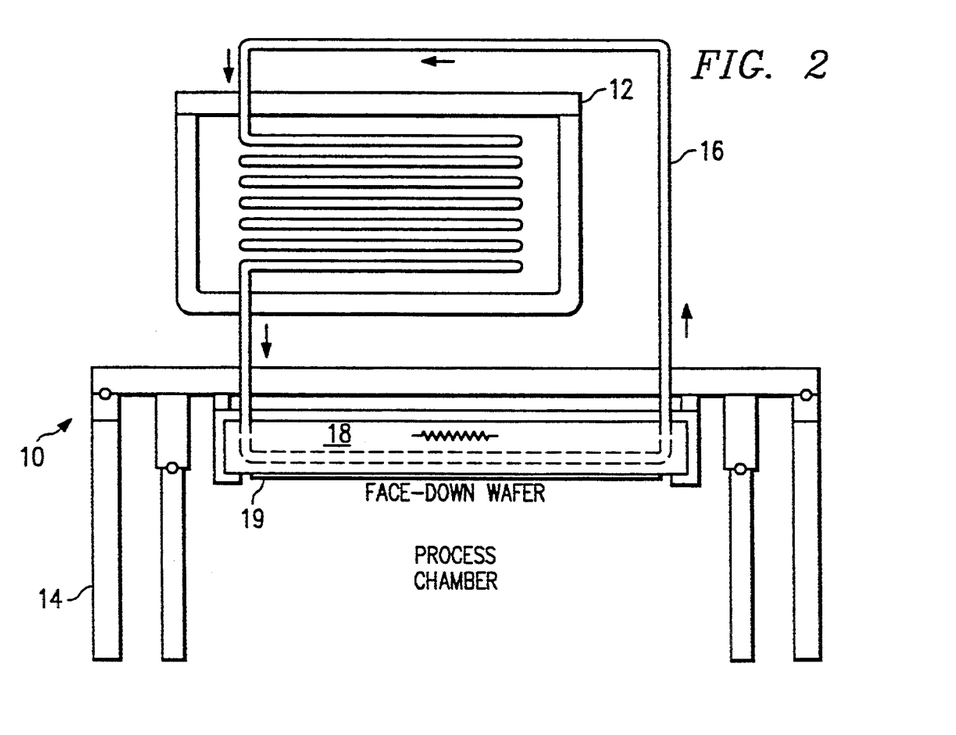
FIG. 2 is a block diagram of a semiconductor processing system implementing a chilling system.

FIG. 2 illustrates a block diagram of a semiconductor processing system 10 implementing a chilling system 12 of the present invention. Semiconductor processing system 10 includes chilling system 12 coupled to a processing apparatus 14 by a pipe 16. Processing apparatus 14 may operate a number of processes in the fabrication of semiconductor devices. For example, processing apparatus 14 may be an ECR plasma processing system as described in U.S. Pat. No. 4,996,077 issued Feb. 26, 1991 to Moslehi, et al. and incorporated by reference herein, or a magnetron plasma processing system as described in U.S. Pat. No. 5,082,542 issued Jan. 21, 1992 to Moslehi, et al. and incorporated by reference herein, or any other processing system as exemplified in FIG. 1.

Processing apparatus 14 includes a housing or chuck 18 in contact with semiconductor substrate 19. Preferably housing 18 is a multipurpose chuck as described in U.S. Pat. No. 5,079,481 issued Jan. 7, 1992 to Moslehi and incorporated by reference herein.

In operation, fluid within pipe 16 flows through chilling system 12 and chills to very low temperatures such as $-175°$ C. Once chilled, the fluid flows into chilling housing 18 through pipe 16. As housing 18 chills, semiconductor substrate 19 in contact with housing 18 also chills. Fabrication processing begins on chilled semiconductor substrate 19 improving etch profile anisotropy as compared to conventional unchilled fabrication processing.

Figure 3:
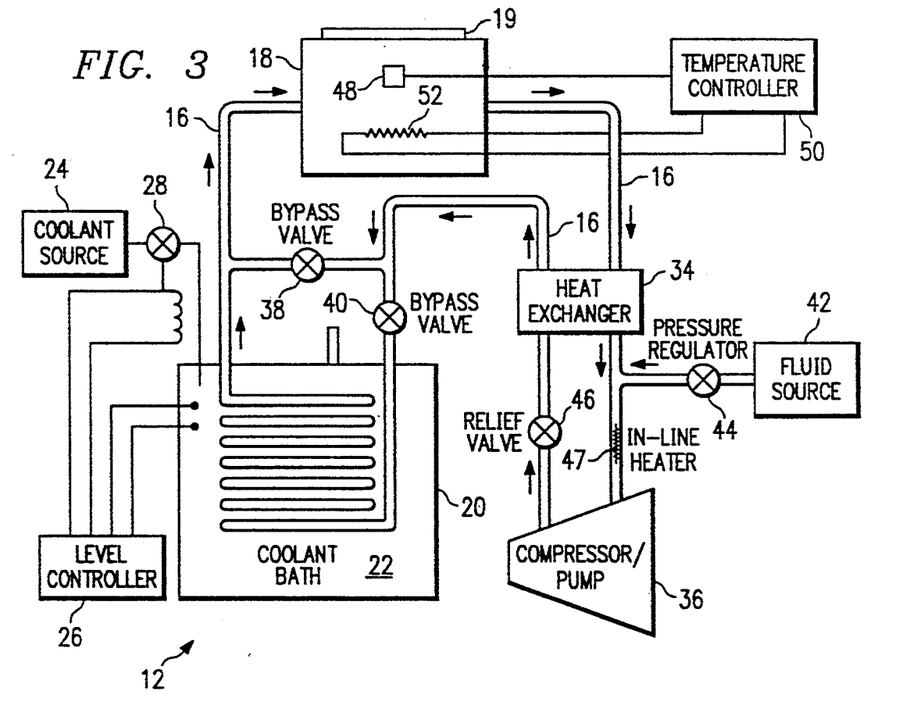
FIG. 3 is a block diagram of the preferred embodiment of the chilling system.

FIG. 3 illustrates a detailed block diagram depiction of chilling system 12. Chilling system 12 includes a container 20 for holding a coolant 22. A coolant source 24 provides a supply of coolant 22 for container 20. A level controller 26 controls an amount of coolant 22 supplied by coolant source 24 through a valve 28 by measuring a level of coolant 22 within container 20. Pipe 16 traverses within container 20 and coolant 22 to housing 18. A heat exchanger 34 couples to housing 18 and container 20 by pipe 16. A compressor/pump 36 couples to heat exchanger 34 through pipe 16. Pipe 16 has two bypass valves 38 and 40 at container 20. A fluid source 42 provides fluid into pipe 16 through a pressure regulator 44. A relief valve 46 and an in-line heater 47 also connect to pipe 16 in the vicinity of compressor/pump 36. Housing 18 has a temperature sensor 48 connected to a temperature controller 50 that drives a heater 52.

In operation, coolant 22 fills container 20 from coolant source 24 to a desired level as determined by level controller 26. Fluid enters pipe 16 from fluid source 42 at a predetermined pressure maintained by pressure regulator 44. Compressor/pump 36 forces the fluid through pipe 16 into container 20 and coolant 22. Coolant 22 chills the fluid prior to the fluid entering housing 18. Once in housing 18, the fluid chills housing 18 which in turn chills semiconductor wafer 19 in contact with housing 18. The fluid continues to flow through pipe 16 to compressor/pump 36 where the fluid is continuously recycled back through container 20, coolant 22, and housing 18. Though a preferred closed-loop system is shown, chilling system 12 may implement a higher cost open-loop system that does not recycle the fluid flowing within the pipe.

In the preferred embodiment, the fluid from fluid source 42 is a compressed gas. This gas should have a condensation point below the condensation point of coolant 22 within container 20. This requirement insures that the gas continuously flows through pipe 16 without turning into a liquid upon being chilled that could reduce flow effectiveness. Preferably, coolant 22 is liquid nitrogen, the fluid is compressed helium, and compressor/pump 36 is a compressor forcing the helium gas through pipe 16. In alternate embodiments to be discussed, the fluid from fluid source 42 is a liquid and compressor/pump 36 is a pump forcing the liquid through pipe 16.

To ensure effective and efficient operation of compressor/pump 36, a heat exchanger 34 is included in chilling system 12. Heat exchanger 34 removes heat from the fluid leaving compressor/pump 36, effectively prechilling the fluid before it enters container 20 and coolant 22. The heat removed from the fluid leaving compressor/pump 36 is applied to the fluid entering compressor/pump 36 that remains at a low temperature after flowing through housing 18. Preferably, the fluid entering compressor/pump 36 is heated to near ambient temperature by heat exchanger 34. By heating the fluid prior to entering compressor/pump 36, efficient operation of compressor/pump 36 is maintained without fear of shutdown due to freezing. In addition to heat exchanger 34, an in-line heater 47 within pipe 16 may be used to provide heat to the fluid entering compressor/pump 36 and further ensuring that compressor/pump 36 does not receive cryogenic temperature fluid.

Temperature control of housing 18 is performed by temperature controller 50. Temperature controller 50 receives a signal from temperature sensor 48 indicating the temperature of housing 18. If the temperature within housing 18 is too low, temperature controller 50 activates heater 52 until a desired temperature is reached as measured by temperature sensor 48. Temperature controller 50 may also operate bypass valves 38 and 40 allowing the fluid to enter housing 18 without traversing through container 20 and coolant 22 in order to provide additional control of the temperature at housing 18. Additionally, temperature controller 50 may also operate with level controller 26 to adjust a level of coolant 22 within container 20 and vary the exposure of pipe 16 to coolant 22 for further temperature control. One or a combination of these control methods may be used to adjust the semiconductor substrate temperature.

Pressure regulator 44 controls the pressure of the fluid within pipe 16. Relief valve 46 ensures that pipe 16 does not become overpressurized. Pressure of the fluid within pipe 16 is another parameter that is used to control the temperature of housing 18.

Figure 4:
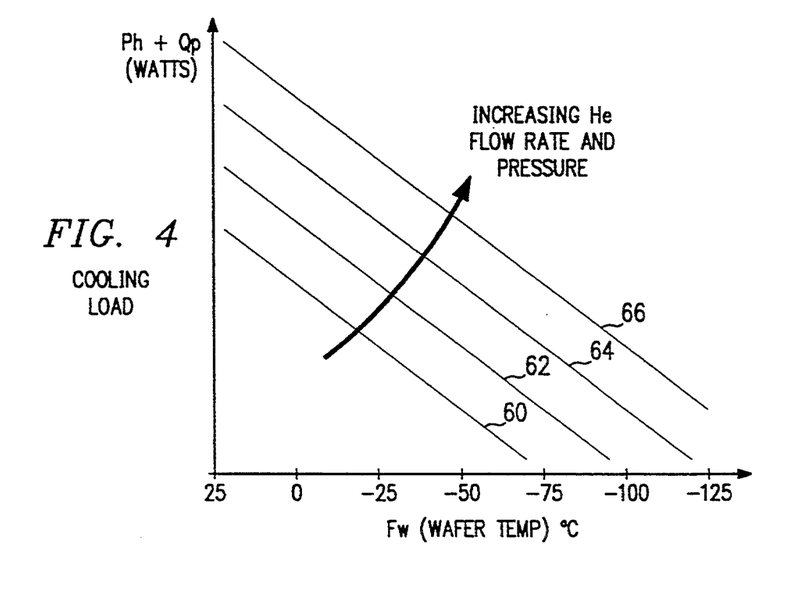
FIG. 4 is a graph of a qualitative relationship among wafer temperature, cooling load, and fluid pressure.

FIG. 4 illustrates a graph showing the qualitative relationship between the cooling load placed on housing 18 and the temperature of semiconductor substrate 19 in contact with housing 18 for various flow rates and pressures of fluid flowing through pipe 16. The cooling load on housing 18 is a function of the power $Q_p$, placed on housing 18 during semiconductor device processing performed by processing apparatus 14, and the power $P_h$, placed on housing 18 by heater 52. Temperature sensor 48 measures the temperature of housing 18 which is effectively close to the temperature of semiconductor substrate 19 in contact with housing 18. Each of the curves 60, 62, 64, and 66 represent increasingly specific flow rates and pressures of the fluid flowing through pipe 16 as set by pressure regulator 44 and compressor/pump 36. As shown by the graph, as the cooling load increases, the temperature of semiconductor substrate 19 increases. To maintain proper temperature of the semiconductor substrate 19, the flow rate and pressure of the fluid within pipe 16 must be increased as the cooling load increases. Therefore, to maintain constant semiconductor substrate 19 temperature, the flow rate and pressure of the fluid must be increased in order to traverse from flow curve 60 to 62 to 64 to 66 and so on for increases in the cooling load on housing 18.

Figure 5:
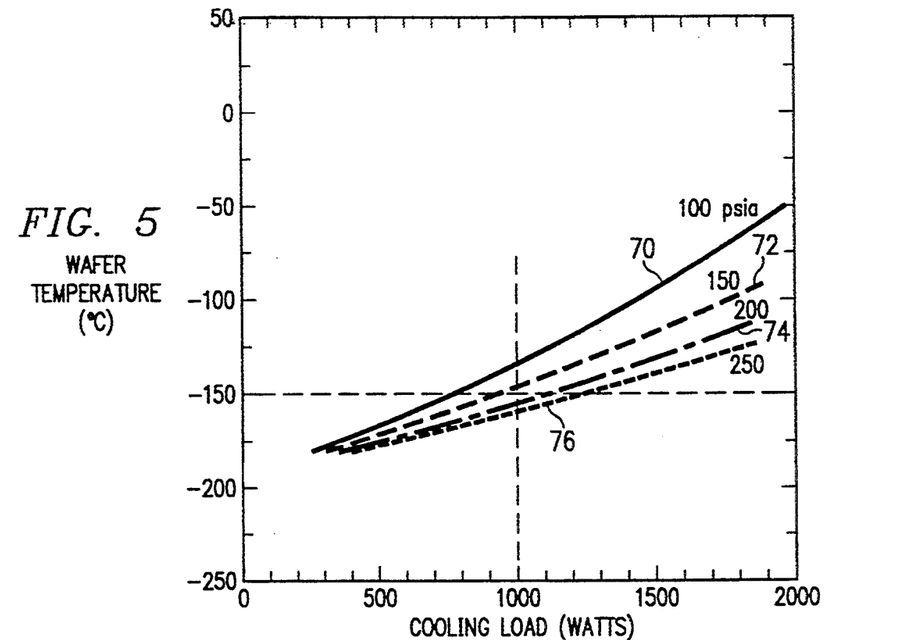
FIG. 5 is a graph of a simulated relationship among wafer temperature, cooling load, and fluid pressure.

FIG. 5 illustrates a graph representing the relationship between the cooling load on housing 18 and semiconductor substrate 19 temperature for various fluid pressure values, as determined through thermal simulation techniques. Curve 70 corresponds to a fluid pressure within pipe 16 of 100 PSI, curve 72 corresponds to a fluid pressure of 150 PSI, curve 74 corresponds to a fluid pressure of 200 PSI, and curve 76 corresponds to a fluid pressure of 250 PSI. Thus, in order to maintain a constant temperature for semiconductor substrate 19 of −150° C., the fluid pressure within pipe 16 must be increased from 100 PSI of curve 70 to 150 PSI of curve 72 and so forth as the cooling load on housing 18 increases.

Figure 6:
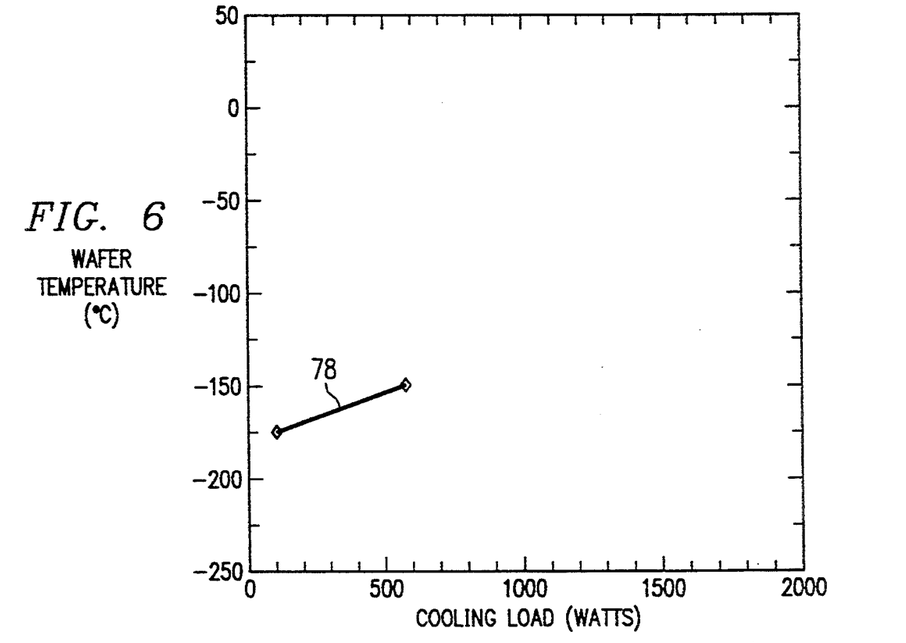
FIG. 6 is a graph of an actual measured relationship between wafer temperature and cooling load at a constant fluid pressure.

FIG. 6 illustrates a graph showing the measured relationship between semiconductor wafer temperature and cooling load as determined by experimentation. Curve 78 corresponds to a constant fluid pressure within pipe 16 of 170 PSI. As shown, for small cooling loads on housing 18, the temperature of housing 18 and semiconductor substrate 19 can reach as low as approximately −175° C. As cooling load increases, the temperature of housing 18 and semiconductor substrate 19 increases for a constant pressure of fluid within pipe 16. Preferably, the pressure applied to the fluid (compressed helium) within pipe 16 is approximately 250 PSI.

The fluid flowing within chilling system 12 may also be a liquid refrigerant that is typically a mixture of methanol, glycol, and water, or other refrigerants may be used such as methylcyclohexane or CryoCool®. The liquid refrigerant should possess a low freezing point, reasonable heat transfer characteristics, and a low viscosity particularly at low temperatures.

Figure 7:
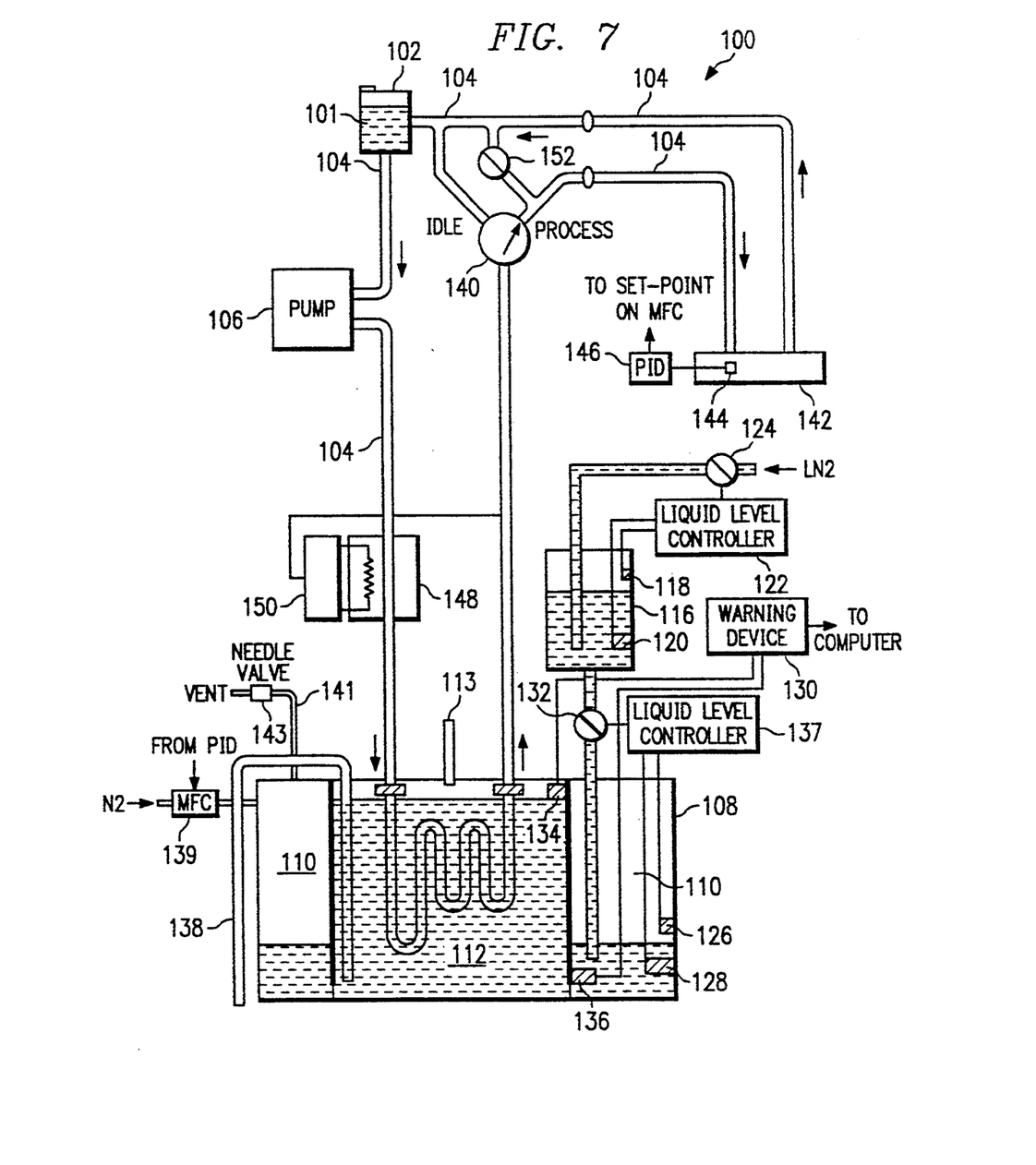
FIG. 7 is a block diagram of an alternate embodiment of the chilling system using liquid as the fluid.

FIG. 7 depicts an alternative embodiment for a chilling system implementing a liquid for chilling a housing and semiconductor substrate in contact with the housing. Chilling system 100 includes a liquid 101 within a tank 102 coupled to a pipe 104. Pipe 104 couples tank 102 to a pump and motor 106 and traverses within a container 108 having two chambers, an outer chamber 110 and an inner chamber 112. Inner chamber 112 has a vent line 113. Coolant, preferably liquid nitrogen, enters container 108 from a filling tank 116. Filling tank 116 has level sensors 118 and 120 connected to a liquid level controller 122. Liquid level controller 122 is connected to valve 124 controlling the amount of coolant entering filling tank 116. Container 108 has level sensors 126 and 128 connected to liquid level controller 130 which activates valve 132 controlling the amount of coolant entering container 108. Container 108 has level sensors 134 and 136 connected to a warning device 137. Container 108 also has a siphon 138, a mass-flow controller 139, a vent line 141, and a needle valve 143. Pipe 104 traverses through chamber 112 and connects to a two-way valve 140. Two-way valve 140 directs liquid flow to either housing 142 or to tank 102 bypassing housing 142. Housing 142 has a temperature sensor 144 connected to a temperature controller 146. An electric heater 148 couples to pipe 104 through a temperature controller 150. Pipe 104 also has a pressure-activated bypass valve 152.

Chilling system 100 operates in one of two modes, idle or process, depending on the position of two-way valve 140. In idle mode, liquid is forced through pipe 104 by pump and motor 106 and back to tank 102 bypassing housing 142. During idle mode, flow rate of a gas through mass-flow controller 139 is turned off allowing the level of coolant within chamber 110 and 112 to equalize clearing pipe 104 from the coolant. Electric heater 148 keeps the liquid from freezing within pipe 104 as sensed by temperature controller 150. The system can also be shut down by forcing the gas into chamber 110 through mass-flow controller 139 which causes coolant to siphon out through siphon 138 thereby draining container 108. For shut down, all warning sensors and level controllers are disabled.

During process mode, two-way valve 140 is set to the process position and pipe 104 becomes partially immersed in the coolant due to the gas entering chamber 110 through mass-flow controller 139. Preferably, the gas flowing at mass-flow controller 139 is nitrogen and the coolant within container 108 is liquid nitrogen. Level controller 122 maintains the coolant level in filler tank 116 between sensors 118 and 120 through valve 124. Level controller 130 maintains the level of coolant within chamber 110 between sensors 126 and 128 through valve 132. If the coolant level falls below sensor 136 or above sensor 134, warning device 137 actuates a warning signal to reduce the flow rate of the nitrogen until the situation is corrected. Bypass valve 152 ensures that pipe 104 does not become overpressurized by the liquid.

Temperature sensor 144 and temperature controller 146 determine the amount of coolant surrounding pipe 104 by controlling mass-flow controller 139 which adjusts the amount of gas flowing into chamber 110 and varies the levels of coolant within chambers 110 and 112. A differential pressure between chamber 110 and chamber 112 caused by the flow of nitrogen gas through mass-flow controller 139 raises the level of coolant in chamber 112 relative to chamber 110. Chamber 112 is maintained at atmospheric pressure through a vent line 113. Chamber 110 also has a vent line 141 with a variable needle valve 143 installed in the line. The setting on the needle valve 143 is adjusted so that optimum coolant level control can be achieved over the range of the mass-flow controller 139. The set-point on mass-flow controller 139 is controlled by temperature controller 146 and temperature sensor 144. If the temperature of housing 142 is higher than the desired temperature, the flow rate of the nitrogen gas and consequently the cooling capacity is increased until the desired temperature is obtained. When the flow rate of the nitrogen gas is increased, the level of coolant within chamber 112 increases surrounding more of pipe 104. Therefore, the cooling capacity of chilling system 100 is adjustable by varying the level of coolant immersing the pipe. Chilling system 100 is capable of achieving a peak cooling capacity of 10 KW when the coolant within chamber 112 is at its maximum level and a continuous cooling capacity of 2 KW at a temperature of −100° C.

Figure 8:
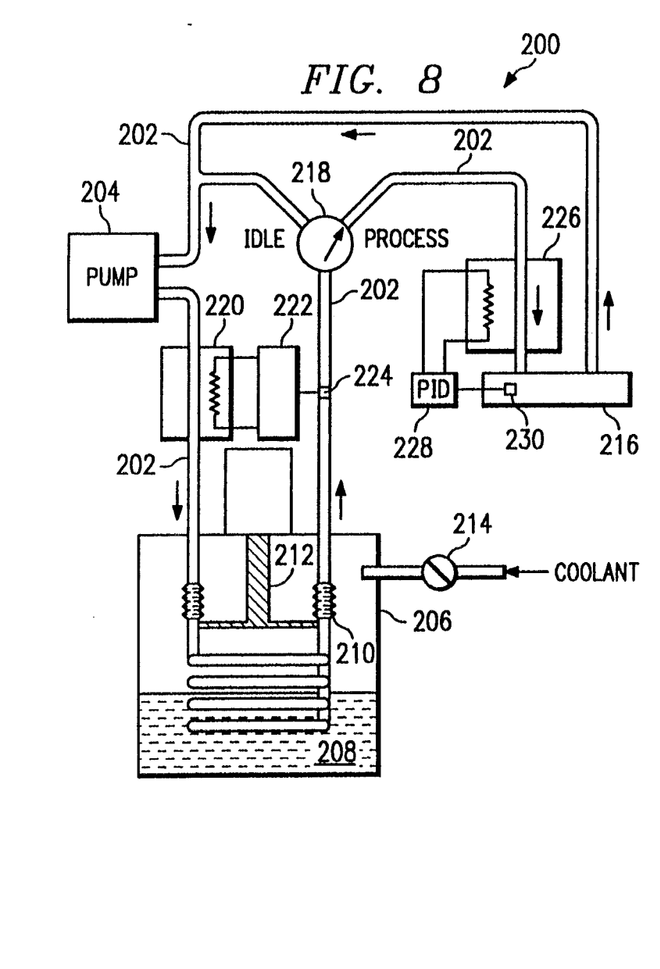
FIG. 8 is a block diagram of another alternate embodiment of the chilling system using liquid as the fluid.

FIG. 8 depicts an alternate embodiment to the liquid refrigerant chilling system of FIG. 7. In FIG. 8, chilling system 200 has liquid refrigerant flowing through a pipe 202 into a pump 204. Pipe 202 traverses within an insulated container 206 filled with a coolant 208, preferably liquid nitrogen. A portion of pipe 202 comprises a flexible tubing 210 connected to a retractable plunger 212. A valve 214 supplies coolant 208 to container 206. Pipe 202 couples to a housing 216 through a two-way valve 218. Pipe 202 traverses through housing 216 and back to pump 204 establishing a closed-loop system. An electric heater 220 controlled by a temperature controller 222 and a thermocouple 224 are connected to pipe 202 in the vicinity of container 206. Another electric heater 226 controlled by a temperature controller 228 and a thermocouple 230 are connected to pipe 202 in the vicinity of housing 216.

Chilling system 200 has two modes of operation, idle and process. In idle mode, two-way valve 218 is set to the idle position and pipe 202 is retracted out of coolant 208 by retractor plunger 212. Electric heater 220 prevents the liquid refrigerant from freezing by activating in response to temperature controller 222 from a signal at thermocouple 224. In process mode, two-way valve 218 is set to the process position and pipe 202 is partially immersed within coolant 208 by retractor 212 and flex tubing 210. Electric heater 226 through temperature controller 228 and housing thermocouple 230 controls the temperature of chuck 216. Thermocouple 230 may also control retractable plunger 212 adjusting the amount of pipe submerged within coolant 208 for further temperature control of housing 216. Pump 204 forces the liquid refrigerant through pipe 202. Chilling system 200 is similar to chilling system 100 except that instead of altering the coolant level surrounding the pipe, the pipe is raised and lowered within the coolant.

Figure 9:
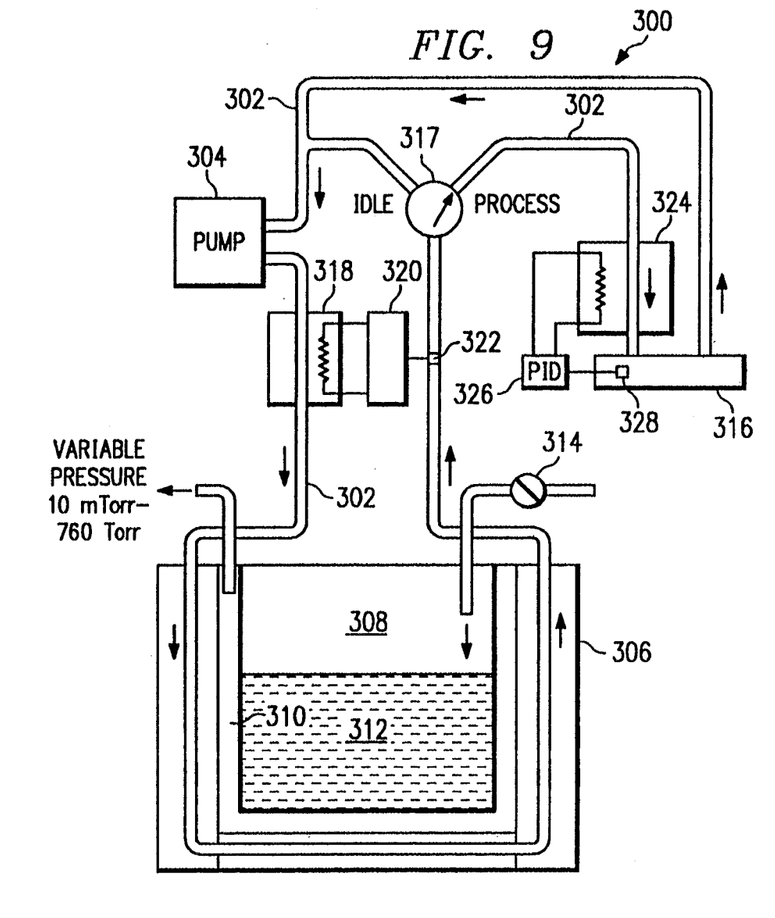
FIG. 9 is a block diagram of yet another alternate embodiment of the chilling system using liquid as the fluid.

FIG. 9 illustrates yet another embodiment of a liquid refrigerant chilling system. Chilling system 300 has a pipe 302 connected to a pump 304. Pipe 302 is embedded in the wall of a container 306. Container 306 comprises two chambers 308 and 310. A coolant 312, preferably liquid nitrogen, is placed in chamber 308 through a valve 314. Outer chamber may contain multilayer insulation whose thermal conductivity is a function of air pressure in inner spaces of the insulation. Pipe 302 continues into a housing 316 by way of a two-way valve 317 and returns to pump 304 establishing a closed loop system. An electric heater 318 with a temperature controller 320 and a thermocouple 322 are connected to pipe 302 in the vicinity of container 306. An electric heater 324 with a temperature controller 326 and a thermocouple 328 are connected to pipe 302 in the vicinity of housing 316.

Chilling system 300 also operates in two modes, idle and process. In idle mode, two-way valve 317 is set to the idle position, forcing liquid refrigerant to bypass housing 316. Chamber 310 is set to a minimum pressure of 10 mTorr. Electric heater 318 prevents the liquid refrigerant from freezing and is activated by temperature controller 320 into response to a signal from thermocouple 322. Further freezing prevention occurs by not immersing pipe 302 in coolant 312. In process mode, two-way valve 317 is set to the process position and the pressure in chamber 310 is increased so that the liquid refrigerant within pipe 302 is maintained at a desired set-point temperature. Electric heater 324 controls the temperature within housing 316 and is activated by temperature controller 326 in response to a signal from thermocouple 328. The cooling capacity of chilling system 300 varies as the pressure applied to chamber 310 changes.

At the highest air pressure, the thermal conductivity of the multilayer insulation within chamber 310 is at its maximum value and its thermal resistance is at its minimum value, thereby yielding a maximum cooling capacity for chilling system 300. The thermal conductivity of the multilayer instruction within chamber 310 can vary by three orders of magnitude over a pressure range of 10 mTorr to 760 Torr. The maximum value of the thermal conductivity defines the maximum cooling capacity that can be achieved with chilling system 300. Commercially available multilayer insulation can achieve a peak cooling capacity of 1 KW.

Figure 10:
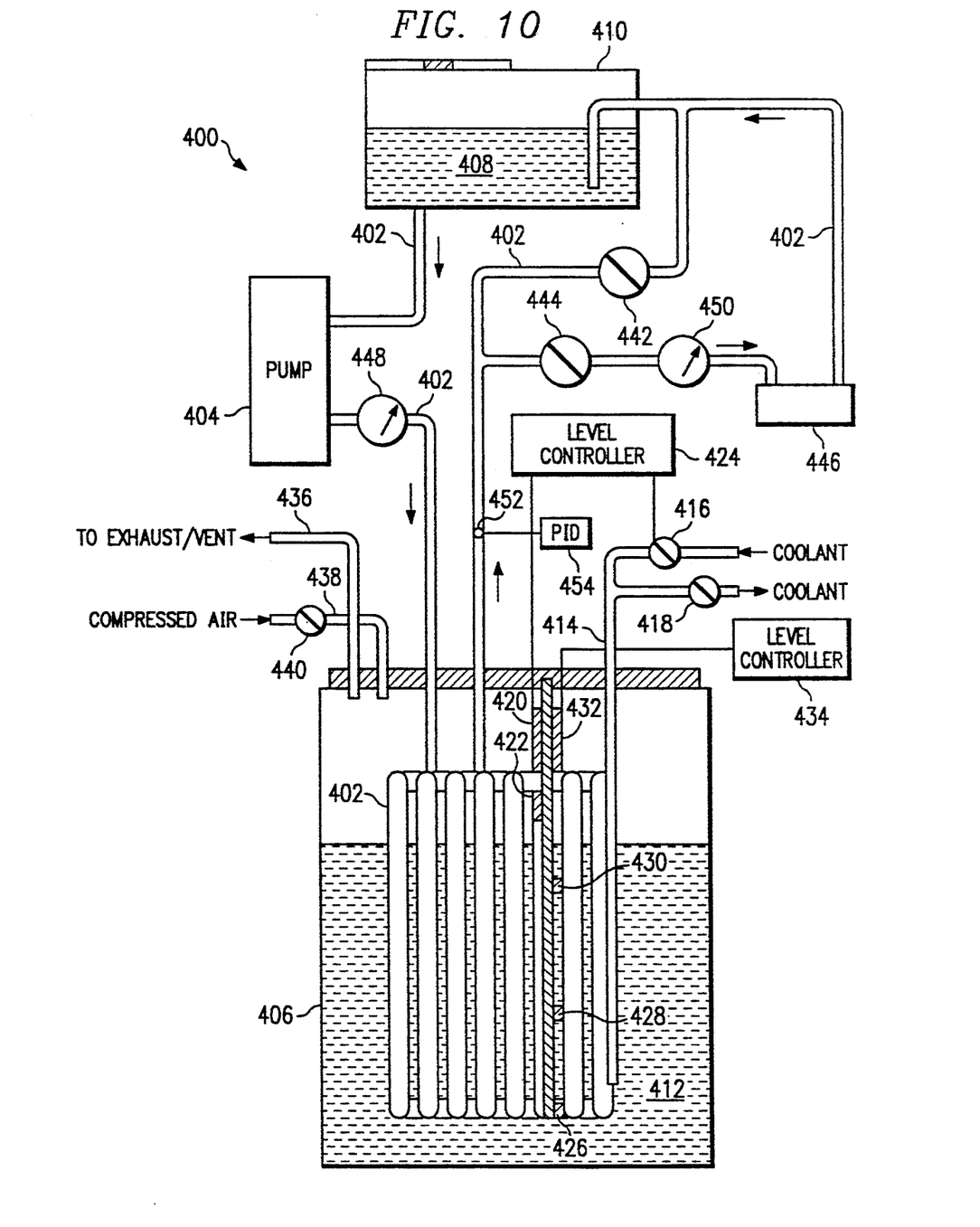
FIG. 10 is a block diagram of still another alternate embodiment of the chilling system using liquid as the fluid.

FIG. 10 illustrates still another embodiment of a liquid refrigerant chilling system. Chilling system 400 has a pipe 402 connecting to a pump 404 and traversing through a container 406. The portion of pipe 402 within container 406 is surrounded with insulation. A liquid refrigerant 408 enters pipe 402 from a refrigerant tank 410. Container 406 holds a coolant 412 supplied through a supply line 414. Coolant 412 flows into and out of container 406 in supply line 414 through a supply valve 416 and a drain valve 418. Container 406 has two level sensors 420 and 422 connecting to a level controller 424. Container 406 also has level sensors 426, 428, 430, and 432 connecting to a level controller 434. Container 406 connects to a vent line 436 and a vent line 438 having a valve 440. Pipe 402 traverses to refrigerant tank 410 through a bypass valve 442. Pipe 402 also traverses to refrigerant tank 410 through a load valve 444 and a housing 446. Pipe 402 has a pump pressure gauge 448 in the vicinity of pump 404 and a load pressure gauge 450 in the vicinity of housing 446. A thermocouple 452 connects to pipe 402 and sends signals to a temperature controller 454.

In operation, liquid refrigerant 408 enters pipe 402 from refrigerant tank 410 and forces through pipe 402 by pump 404. Liquid refrigerant 408 enters container 406 and the insulated portion of pipe 402 where coolant 412 provides a chilling effect. Once chilled, liquid refrigerant 408 continues to flow through pipe 402 into housing 446 to chill semiconductor substrate in contact with housing 446. Liquid refrigerant 408 returns to refrigerant tank 410 for subsequent recycling through pipe 402 of the closed-loop system. Preferably, coolant 412 is liquid nitrogen and pipe 402 is insulated with teflon. Liquid refrigerant 408 may comprise Cryo-Cool ® or methylcyclohexane. CryoCool ® is non-toxic, non-flammable and has a lower viscosity while methylcyclohexane has better thermal characteristics and provides better cooling capacity.

Temperature controller 454, in conjunction with thermocouple 452 controls the temperature of liquid refrigerant 408 within pipe 402. Thermocouple 452 lies in the portion of pipe 402 where liquid refrigerant 408 exits container 406, the lowest temperature point in the liquid refrigerant flow path. Thermocouple 452 monitors the temperature of liquid refrigerant 408 exiting container 406 and sends temperature information to temperature controller 454. In conjunction with level controller 434 through level sensors 426, 428, 430, and 432, temperature controller 454 varies the amount of coolant 412 within container 406 in response to temperature information received from thermocouple 452. If the temperature sensed by thermocouple 452 is below a set-point temperature, temperature controller 454 lowers the level of coolant within container 406 by closing supply valve 416, opening drain valve 418, and opening air valve 440 such that compressed air entering container 406 through valve 440 and vent line 438 forces coolant 412 to siphon into supply line 414 and drain out of drain valve 418. A soft vacuum exhaust at drain valve 418 and the compressed air entering container 406 through air valve 440 and vent line 438 establishes the siphon effect of supply line 414. Air valve 440 and drain valve 418 energize simultaneously and never concurrently with supply valve 416. If the temperature sensed by thermocouple 452 is above the set-point temperature, temperature controller 454 energizes supply valve 416 to allow coolant to enter container 406 and increase the amount of pipe 402 immersed within coolant 412. Level controller 424 in response to signals from level sensors 420 and 422 ensures that container 406 is never overfilled with coolant 412.

Pump pressure gauge 448 monitors the pressure of liquid refrigerant 408 within pipe 402 as it exits pump 404. If the pressure sensed by pump pressure gauge 448 exceeds 90 PSI, pump 404 is shut off and coolant 412 siphons out of container 406 through supply line 414. Load pressure gauge 450 monitors the pressure of liquid refrigerant 408 within pipe 402 as it enters housing 446. If the pressure sensed by load pressure gauge 450 exceeds 70 PSI, pump 404 is shut off and coolant 412 again siphons out of container 406. Chilling system 400 must be reset after a pump shut off occurrence before normal operation can resume. Bypass valve 442 controls the pressure of liquid refrigerant 408 within pipe 402. For each desired set-point temperature, bypass valve 442 is set such that the load pressure is less than 40 PSI and the pump pressure is less than 70 PSI. No further adjustment to bypass valve 442 is required unless the set-point temperature is changed. Monitoring the pressure within pipe 402 guards against freezing of liquid refrigerant 408. Further freezing protection occurs by using the insulation on pipe 402 within container 406.

Chilling system 400 achieves a peak cooling capacity of 1.7 KW at −20° C. and provides a continuous cooling capacity of 800 W at −80° C. using methylcyclohexane as the liquid refrigerant. The cooling capacity for CryoCool ® is approximately 30% less than that of methylcyclohexane. A transient thermal response time of 15 minutes occurs when changing the set-point temperature from −20° C. to −80° C. Heat-up rates are slightly lower. Various embodiments of this invention employ proper thermal insulation for various system components, such as pipes and containers, in order to maximize the system chilling efficiency.

In summary, the chilling systems of the present invention use a fluid flowing through a pipe and entering a container for chilling. The chilled fluid enters a housing effectively chilling semiconductor substrate in contact with the housing. In the preferred embodiment, a gaseous fluid flows through the pipe, though a liquid fluid may also be used as described above. The container holds a coolant for chilling the fluid through the pipe. The chilling systems described herein are more compact, quiet, inexpensive, and respond better to changes in cooling loads as opposed to conventional refrigeration systems presently in use.

Thus, it is apparent that there has been provided in accordance with the present invention a method and apparatus for chilling semiconductor substrate in a processing equipment that satisfies the advantages set forth above. Although the preferred embodiment has been described in detail, it should be understood that various changes, substitutions, and alterations can be made herein. For example, though the chilling system is shown in conjunction with an etching process, the chilling system may be used in numerous other applications not related to semiconductor device fabrication processing. Other examples are readily ascertainable by one skilled in the art and could be made without departing from the spirit and scope of the present invention as defined by the following claims.

What is claimed is:

1. An apparatus for low-temperature semiconductor processing, comprising:
   a container;
   a housing in contact with a semiconductor substrate;
   a pipe forming a path within said container and into said housing;
   a fluid flowing within said pipe, said container chills said fluid through said pipe, said fluid chills said housing and said semiconductor substrate in contact with said housing through said pipe;
   a coolant within said container;
   a level controller connected to said container, said level controller measures a level of said coolant within said container; and
   a coolant source connected to said container, said coolant source provides a supply of said coolant to said container, said level controller varies said suppply in response to said level within said container, and wherein said level controller adjusts a temperature of said fluid by varying said level in order to change an amount of said pipe immersed in said coolant.

2. The apparatus of claim 1, wherein said pipe forms a continuous path to allow said fluid to continuously recycle through said container and said housing.

3. The apparatus of claim 2, further comprising:
   a compressor connected to said pipe to force said fluid through said pipe.

4. The apparatus of claim 3, further comprising:
   an in-line heater connected to said pipe to heat said fluid prior to entering said compressor.

5. The apparatus of claim 4, further comprising:
   a heat exchanger coupled to said compressor by said pipe to heat said fluid up to near ambient temperature prior to entering said compressor and prechill said fluid after leaving said compressor and before entering said container.

6. The apparatus of claim 1 wherein said fluid is a gas, said gas has a condensation point below a condensation point of coolant within said container.

7. The apparatus of claim 6, wherein said gas is helium.

8. The apparatus of claim 1, further comprising:
   a level controller connected to said container, said level controller measures a level of said coolant with said container.

9. The apparatus of claim 1, further comprising:
   a bypass valve connected to said pipe to allow said fluid to bypass said container in order to control a temperature of said fluid within said housing.

10. The apparatus of claim 1, further comprising:
    a pressure regulator connected to said pipe to control a pressure of said fluid within said pipe.

11. The apparatus of claim 10, wherein said pressure is maintained at approximately 250 pounds per square inch.

12. The apparatus of claim 10, further comprising:
a relief valve connected to said pipe to prevent overpressurization of said fluid within said pipe.

13. The apparatus of claim 1, wherein said housing has a temperature sensor, said temperature sensor monitors a temperature of said housing.

14. The apparatus of claim 13, wherein said housing has a heating element coupled to said temperature sensor to control said temperature of said housing.

15. The apparatus of claim 14, wherein said temperature is controlled over a continuous range between 0° C. and −175° C.

16. The apparatus of claim 1, wherein said fluid is a liquid.

17. The apparatus of claim 16, further comprising:
a pump connected to said pipe to force said liquid through said pipe.

18. The apparatus of claim 1, wherein said housing is a multi-purpose chuck.

19. The apparatus of claim 1, further comprising:
a fluid source connected to said pipe to provide a supply of said fluid to said pipe.

20. An apparatus for low-temperature semiconductor processing, comprising:
a container;
a housing in contact with a semiconductor substrate;
a pipe forming a path within said container and into said housing;
a fluid flowing within said pipe, said container chills said fluid through said pipe, said fluid chills said housing and said semiconductor substrate in contact with said housing through said pipe;
a coolant within said container;
a level controller connected to said container, said level controller measures a level of said coolant within said container; and
a coolant source connected to said container, said coolant source provides a supply of said coolant to said container, said level controller varies said suppply in response to said level within said container, and wherein said level controller adjusts a temperature of said fluid by varying said level in order to change an amount of said pipe immersed in said coolant; and
wherein a temperature of said liquid is controlled by raising or lowering said pipe in said container.

21. An apparatus for low-temperature device processing, comprising:
a container for holding a coolant;
a housing in contact with a semiconductor substrate;
a pipe forming a path within said container and into said housing;
a liquid flowing within said path, said container chills said liquid through said pipe, said liquid chills said housing and said semiconductor substrate through said pipe; and
a retractable plunger connected to said pipe to raise and lower said pipe within said container by contracting and expanding said flexible tubing.

22. The apparatus of claim 21, wherein a portion of said pipe within said container comprises flexible tubing.

23. The apparatus of claim 22, further comprising:
a temperature controller to sense and control a temperature of said housing, said temperature controller adjusts a level of said pipe within said container by operating said retractable plunger.

24. The apparatus of claim 23, further comprising:
a housing heater coupled to said temperature controller to raise said temperature of said housing in response to signals from said temperature controller.

25. The apparatus of claim 24, further comprising:
a two-way valve connected to said pipe having a first setting to change said path of said liquid in order to bypass said housing and a second setting allowing said liquid to enter said housing.

26. The apparatus of claim 25, further comprising:
a coolant source to supply and maintain an amount of coolant within said container.

27. The apparatus of claim 26, wherein said retractable plunger removes said pipe from said coolant in response to said first setting.

28. The apparatus of claim 27, further comprising:
a temperature sensor to sense a temperature of said liquid within said pipe.

29. The apparatus of claim 28, further comprising:
a pipe heater activated by said temperature sensor to prevent said liquid from freezing within said pipe.

30. The apparatus of claim 29, further comprising:
a pump forcing said liquid through said pipe.

31. An apparatus for low-temperature device processing, comprising:
a container for holding a coolant;
a housing in contact with a semiconductor substrate;
a pipe forming a path within said container and into said housing;
a liquid flowing within said path, said container chills said liquid through said pipe, said liquid chills said housing and said semiconductor substrate through said pipe, and wherein said container has an inner chamber for holding coolant and an outer chamber.

32. The apparatus of claim 31, wherein said path is within walls surrounding said outer chamber of said container.

33. The apparatus of claim 32, wherein pressure is applied within said outer chamber to maintain said liquid at a desired temperature.

34. The apparatus of claim 33, further comprising:
a temperature controller to sense and control a temperature of said housing, said temperature controller adjusts an amount of pressure applied to said outer chamber.

35. The apparatus of claim 34, further comprising:
a housing heater to raise said temperature of said housing in response to signals from said temperature controller.

36. The apparatus of claim 35, further comprising:
a two-way valve connected to said pipe having a first setting to change said path of said liquid in order to bypass said housing and a second setting allowing said liquid to enter said housing.

37. The apparatus of claim 36, wherein said pressure is reduced in response to said first setting.

38. The apparatus of claim 31, wherein said inner chamber is in fluid contact with said outer chamber.

39. The apparatus of claim 38, further comprising:
a mass-flow controller connected to said outer chamber to supply a flow of gas into said outer chamber, said flow of gas raises a level of coolant within said container immersing a portion of said pipe in said coolant.

40. The apparatus of claim 39, further comprising:

a siphon within said inner chamber, said mass-flow controller increases said flow of gas such that said coolant leaves said chambers through said siphon in order to shut down the apparatus.

41. The apparatus of claim 40, further comprising:
a temperature controller to sense and control a temperature of said housing, said temperature controller adjusts said flow of gas through said mass-flow controller to vary said level of coolant immersing said pipe.

42. The apparatus of claim 41, further comprising:
a two-way valve connected to said pipe having a first setting to change said path of said liquid in order to bypass said housing and a second setting allowing said liquid to enter said housing.

43. The apparatus of claim 42, wherein said mass-flow controller turns off said flow of gas reducing said level of coolant below said pipe in response to said first setting.

44. The apparatus of claim 43, further comprising:
a vent line connected to said inner chamber to maintain said inner chamber at atmospheric pressure.

45. The apparatus of claim 44, further comprising:
a needle valve coupled to said outer chamber to control said level of coolant over a range of said mass-flow controller.

* * * * *